（12) United States Patent
Sannai et al.

(10) Patent No.: US 11,450,592 B2
(45) Date of Patent: Sep. 20, 2022

(54) SEMICONDUCTOR PACKAGE WITH A PLURALITY OF CHIPS HAVING A GROOVE IN THE ENCAPSULATION

(71) Applicant: Mitsubishi Electric Corporation, Tokyo (JP)

(72) Inventors: Hiroya Sannai, Tokyo (JP); Kei Hayashi, Tokyo (JP); Yosuke Nakata, Tokyo (JP); Tatsuya Kawase, Tokyo (JP); Yuji Imoto, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 45 days.

(21) Appl. No.: 17/267,709

(22) PCT Filed: Dec. 27, 2018

(86) PCT No.: PCT/JP2018/048152
§ 371 (c)(1),
(2) Date: Feb. 10, 2021

(87) PCT Pub. No.: WO2020/136805
PCT Pub. Date: Jul. 2, 2020

(65) Prior Publication Data
US 2021/0225740 A1 Jul. 22, 2021

(51) Int. Cl.
*H01L 23/495* (2006.01)
*H01L 23/34* (2006.01)
(Continued)

(52) U.S. Cl.
CPC .... *H01L 23/49524* (2013.01); *H01L 21/4825* (2013.01); *H01L 21/565* (2013.01);
(Continued)

(58) Field of Classification Search
CPC ........... H01L 2924/181; H01L 21/4825; H01L 21/565; H01L 23/053; H01L 23/49524;
(Continued)

(56) References Cited

U.S. PATENT DOCUMENTS 8,319,333 B2 * 11/2012 Oka ...................... H01L 25/072
438/126
10,032,743 B2 * 7/2018 Bayerer ............ H01L 23/49861
(Continued)

FOREIGN PATENT DOCUMENTS

WO 2012/157583 A1 11/2012

OTHER PUBLICATIONS

International Search Report; Written Opinion; and Notification of Transmittal of the International Search Report and the Written Opinion of the International Searching Authority, or the Declaration issued in PCT/JP2018/048152; dated Mar. 19, 2019.

*Primary Examiner* — Alonzo Chambliss
(74) *Attorney, Agent, or Firm* — Studebaker & Brackett PC

(57) ABSTRACT

A semiconductor device according to the disclosure includes a first semiconductor chip, a second semiconductor chip, a first metal plate provided on an upper surface of the first semiconductor chip, a second metal plate provided on an upper surface of the second semiconductor chip and a sealing resin covering the first semiconductor chip, the second semiconductor chip, the first metal plate and the second metal plate, wherein a groove is formed in the sealing resin, the groove extending downwards from an upper surface of the sealing resin, the first metal plate includes, at an end facing the second metal plate, a first exposed portion exposed from a side face of the sealing resin forming the groove, and the second metal plate includes, at an end facing the first metal plate, a second exposed portion
(Continued)

exposed from a side face of the sealing resin forming the groove.

20 Claims, 11 Drawing Sheets

(51) Int. Cl.
    *H01L 23/28*      (2006.01)
    *H01L 21/00*      (2006.01)
    *H05K 7/20*      (2006.01)
    *H05K 1/00*      (2006.01)
    *H05K 1/18*      (2006.01)
    *H05K 5/02*      (2006.01)
    *H01R 9/00*      (2006.01)
    *H01L 21/48*      (2006.01)
    *H01L 21/56*      (2006.01)
    *H01L 23/31*      (2006.01)
    *H01L 23/00*      (2006.01)
    *H01L 23/053*      (2006.01)

(52) U.S. Cl.
    CPC ........ *H01L 23/053* (2013.01); *H01L 23/3107* (2013.01); *H01L 23/4951* (2013.01); *H01L 23/49562* (2013.01); *H01L 23/49575* (2013.01); *H01L 24/40* (2013.01); *H01L 24/46* (2013.01); *H01L 24/84* (2013.01); *H01L 24/85* (2013.01); *H01L 2924/181* (2013.01)

(58) Field of Classification Search
    CPC ............. H01L 23/3107; H01L 23/4951; H01L 23/49562; H01L 23/49575; H01L 24/38; H01L 24/46; H01L 24/40; H01L 24/84; H01L 24/85
    See application file for complete search history.

(56) References Cited

U.S. PATENT DOCUMENTS

| | | | |
|---|---|---|---|
| 2010/0059875 A1* | 3/2010 | Sato | H01L 24/33 |
| | | | 257/E23.079 |
| 2010/0127383 A1* | 5/2010 | Oka | H01L 25/072 |
| | | | 257/692 |
| 2012/0326289 A1* | 12/2012 | Minamio | H01L 21/565 |
| | | | 257/676 |
| 2014/0042609 A1 | 2/2014 | Nagaune | |

* cited by examiner

SEMICONDUCTOR PACKAGE WITH A PLURALITY OF CHIPS HAVING A GROOVE IN THE ENCAPSULATION

FIELD

The present invention relates to a semiconductor device and a method for manufacturing the semiconductor device.

BACKGROUND

Patent Literature 1 discloses a semiconductor device in which a metal electrode of a semiconductor chip is internally wired to a conductor pattern by an internal connection terminal and an aluminum wire. In addition, a plurality of external lead terminals are drawn from the conductor pattern to an upper surface of a resin case. The internal connection terminal and the external lead terminals are configured as lead frames formed by processing copper plates.

CITATION LIST

Patent Literature

[PTL 1] International Publication No. WO2012157583

SUMMARY

Technical Problem

In Patent Literature 1, external lead terminals and an internal connection terminal are separate bodies. Therefore, there is a possibility that positioning accuracy of the internal connection terminal declines.

The present invention is implemented in order to solve the above-described problem and the object is to provide a semiconductor device capable of improving positioning accuracy of a metal plate inside a package and a method for manufacturing the semiconductor device.

Solution to Problem

A semiconductor device according to the first invention of the present application includes a first semiconductor chip, a second semiconductor chip, a first metal plate provided on an upper surface of the first semiconductor chip, a second metal plate provided on an upper surface of the second semiconductor chip, and a sealing resin covering the first semiconductor chip, the second semiconductor chip, the first metal plate and the second metal plate, wherein a groove is formed in the sealing resin, the groove extending downwards from an upper surface of the sealing resin between the first metal plate and the second metal plate, the first metal plate includes, at an end facing the second metal plate, a first exposed portion exposed from a side face of the sealing resin forming the groove, and the second metal plate includes, at an end facing the first metal plate, a second exposed portion exposed from a side face of the sealing resin forming the groove.

A semiconductor device according to the second invention of the present application includes a first semiconductor chip, a second semiconductor chip, a first metal plate provided on an upper surface of the first semiconductor chip, a second metal plate provided on an upper surface of the second semiconductor chip, and a sealing resin covering the first semiconductor chip, the second semiconductor chip, the first metal plate and the second metal plate, wherein an end of the first metal plate facing the second metal plate extends toward an upper surface of the sealing resin, and is exposed from the upper surface of the sealing resin, and an end of the second metal plate facing the first metal plate extends toward the upper surface of the sealing resin, and is exposed from the upper surface of the sealing resin.

A semiconductor device according to the third invention of the present application includes a first semiconductor chip, a second semiconductor chip, a first metal plate electrically connecting an upper surface of the first semiconductor chip and a back surface of the second semiconductor chip, a first electrode terminal provided separately from the first metal plate and electrically connected with the back surface of the second semiconductor chip, a case including a storage portion configured to store the first semiconductor chip, the second semiconductor chip and the first metal plate, and a peripheral portion surrounding the storage portion, and a sealing resin sealing the storage portion, wherein the first electrode terminal extends to an outer side of the storage portion, and the first metal plate is fixed to the case.

A method for manufacturing a semiconductor device according to the fourth invention of the present application includes loading a frame in which a first metal plate and a second metal plate are integrated through a connection portion such that the first metal plate is provided on an upper surface of a first semiconductor chip and the second metal plate is provided on an upper surface of a second semiconductor chip, covering the frame, the first semiconductor chip and the second semiconductor chip with a sealing resin, and forming a groove in the sealing resin by notching the connection portion together with the sealing resin so as to separate the first metal plate and the second metal plate.

A method for manufacturing a semiconductor device according to the fifth invention of the present application includes a step of fixing a first electrode terminal and a plurality of signal terminals to a peripheral portion of a case including a storage portion and the peripheral portion surrounding the storage portion, a storage step of storing a first semiconductor chip and a second semiconductor chip in the storage portion, and electrically connecting the first electrode terminal and a back surface of the second semiconductor chip, a connection step of connecting a signal terminal connection portion provided on an upper surface of the first semiconductor chip and a signal terminal connection portion provided on an upper surface of the second semiconductor chip and the plurality of signal terminals respectively by wires, after the storage step, and a step of fixing a first metal plate to the case, and electrically connecting the upper surface of the first semiconductor chip and the back surface of the second semiconductor chip by the first metal plate, after the connection step.

Advantageous Effects of Invention

In the semiconductor device according to the first invention of the present application, the first metal plate and the second metal plate are covered with the sealing resin in a state where the first metal plate and the second metal plate are integrated through the connection portion, and the connection portion can be removed by providing the groove in the sealing resin thereafter. Thus, positioning accuracy of the metal plates inside the package can be improved.

In the semiconductor device according to the second invention of the present application, the first metal plate and the second metal plate are covered with the sealing resin in the state where the first metal plate and the second metal plate are integrated through the connection portion, and the connection portion exposed from the upper surface of the sealing resin can be removed thereafter. Thus, the positioning accuracy of the metal plates inside the package can be improved.

In the semiconductor device according to the third invention of the present application, the first metal plate is fixed to the case. Thus, the positioning accuracy of the metal plates inside the package can be improved.

In the method for manufacturing the semiconductor device according to the fourth invention of the present application, the first metal plate and the second metal plate are covered with the sealing resin in the state where the first metal plate and the second metal plate are integrated through the connection portion. Thereafter, the connection portion is notched together with the sealing resin, and the connection portion is removed. Thus, the positioning accuracy of the metal plates inside the package can be improved.

In the method for manufacturing the semiconductor device according to the fifth invention of the present application, after wire-bonding the signal terminal connection portion and the signal terminals, the first metal plate is fixed to the case. Thus, the positioning accuracy of the first metal plate can be improved.

DESCRIPTION OF EMBODIMENTS

Figure 1:
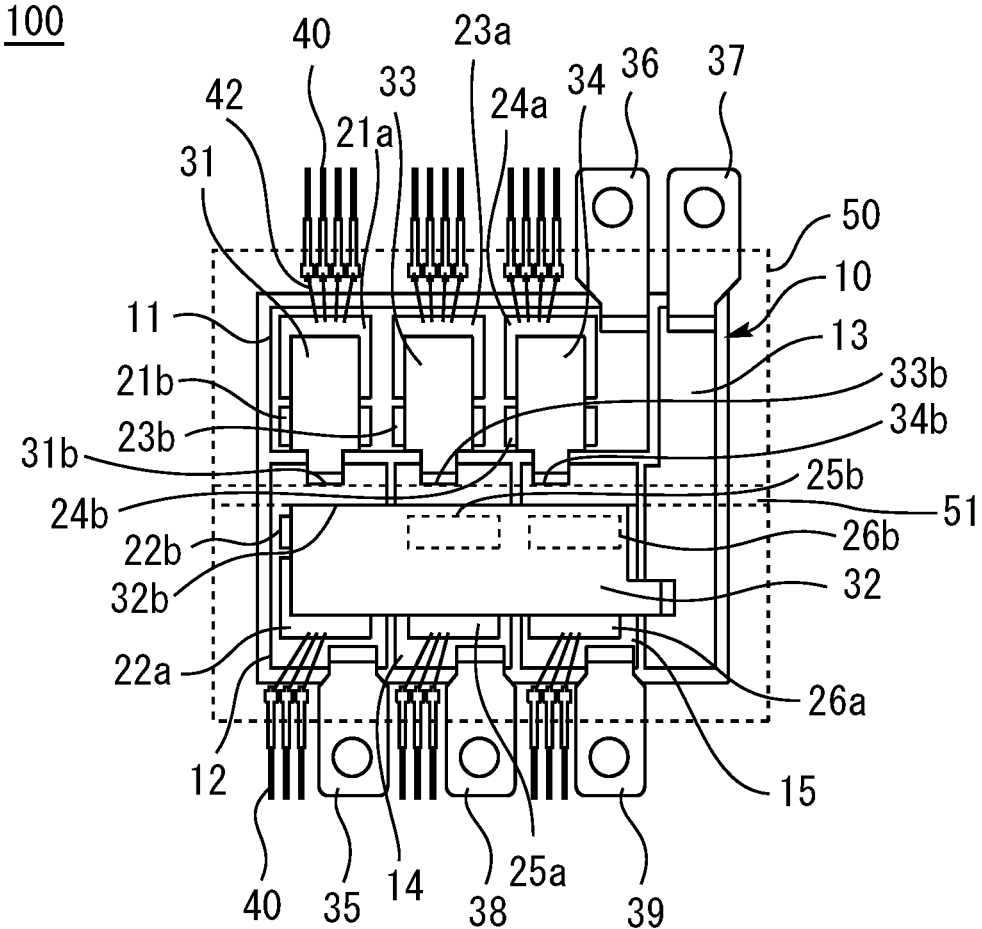
FIG. 1 is a plan view of a semiconductor device relating to the first embodiment.

A semiconductor device and a method for manufacturing the semiconductor device according to embodiments of the present invention are described with reference to drawings. Identical or corresponding constitutional elements are given the same reference numerals, and the repeated description of such constitutional elements may be omitted.

First Embodiment

Figure 2:
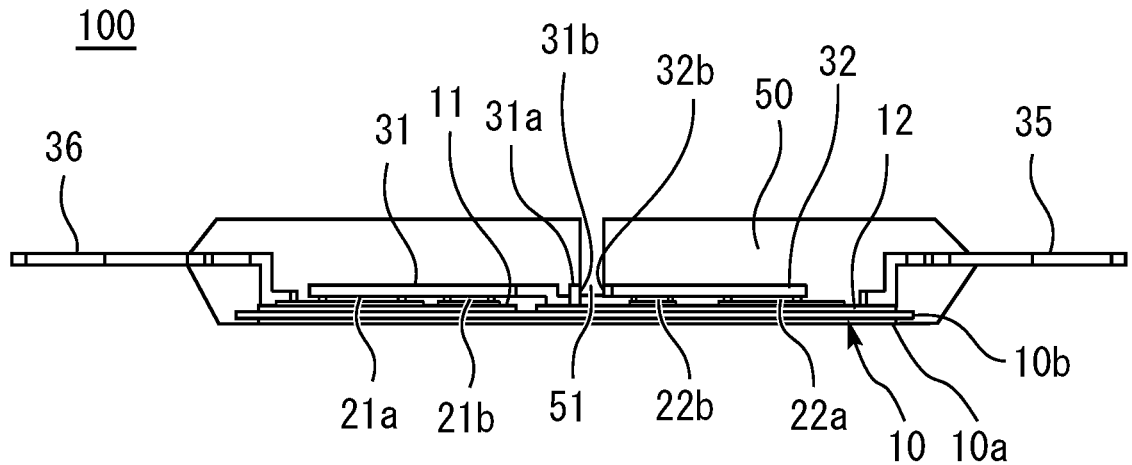
FIG. 2 is a sectional view of the semiconductor device relating to the first embodiment.

FIG. 1 is a plan view of a semiconductor device 100 relating to the first embodiment. FIG. 2 is a sectional view of the semiconductor device 100 relating to the first embodiment. The semiconductor device 100 is a power converter for example. In the present embodiment, the semiconductor device 100 configures a three-phase inverter. The semiconductor device 100 has a DLB (Direct Lead Bonding) structure.

In the semiconductor device 100, a plurality of semiconductor chips are loaded on an insulation substrate 10. The insulation substrate 10 includes an insulating layer 10b, a conductive layer 10a provided on a back surface of the insulating layer 10b, and a first conductive layer 11 to a fifth conductive layer 15 provided on an upper surface of the insulating layer 10b. The first conductive layer 11 to the fifth conductive layer 15 are conductive patterns.

On the upper surface of the first conductive layer 11, a first semiconductor chip 21a, a third semiconductor chip 23a and a fourth semiconductor chip 24a are provided. In addition, on the upper surface of the first conductive layer 11, a first diode 21b, a third diode 23b and a fourth diode 24b are provided. On the upper surface of a second conductive layer 12, a second semiconductor chip 22a and a second diode 22b are provided. Further, on the upper surface of a fourth conductive layer 14, a fifth semiconductor chip 25a and a fifth diode 25b are provided. On the upper surface of the fifth conductive layer 15, a sixth semiconductor chip 26a and a sixth diode 26b are provided.

The first semiconductor chip 21a to the sixth semiconductor chip 26a are IGBTs (Insulated Gate Bipolar Transistors) for example. The first semiconductor chip 21a to the sixth semiconductor chip 26a may be MOSFETs (Metal-Oxide-Semiconductor Field-Effect Transistors). The first diode 21b to the sixth diode 26b are reflux diodes.

The first conductive layer 11 is electrically connected with collectors of the first semiconductor chip 21a, the third semiconductor chip 23a and the fourth semiconductor chip 24a. In addition, the first conductive layer 11 is electrically connected with cathodes of the first diode 21b, the third diode 23b and the fourth diode 24b. The second conductive layer 12 is electrically connected with the collector of the second semiconductor chip 22a and the cathode of the second diode 22b. The fourth conductive layer 14 is electrically connected with the collector of the fifth semiconductor chip 25a and the cathode of the fifth diode 25b. The upper surface of the fifth conductive layer 15 is electrically connected with the collector of the sixth semiconductor chip 26a and the cathode of the sixth diode 26b.

On the upper surface of the first semiconductor chip 21a and the upper surface of the first diode 21b, a first metal plate 31 is provided. The first metal plate 31 connects the upper surface of the first semiconductor chip 21a and the upper surface of the first diode 21b and the upper surface of the second conductive layer 12. That is, the first metal plate 31 electrically connects the upper surface of the first semiconductor chip 21a and the back surface of the second semiconductor chip 22a.

On the upper surfaces of the second semiconductor chip 22a, the second diode 22b, the fifth semiconductor chip 25a, the fifth diode 25b, the sixth semiconductor chip 26a and the sixth diode 26b, a second metal plate 32 is provided. The second metal plate 32 connects the upper surfaces of the second semiconductor chip 22a, the second diode 22b, the fifth semiconductor chip 25a, the fifth diode 25b, the sixth semiconductor chip 26a and the sixth diode 26b and the upper surface of a third conductive layer 13.

On the upper surface of the third semiconductor chip 23a and the upper surface of the third diode 23b, a third metal plate 33 is provided. The third metal plate 33 connects the upper surface of the third semiconductor chip 23a and the upper surface of the third diode 23b and the upper surface of the fourth conductive layer 14. That is, the third metal plate 33 electrically connects the upper surface of the third semiconductor chip 23a and the back surface of the fifth semiconductor chip 25a.

On the upper surface of the fourth semiconductor chip 24a and the upper surface of the fourth diode 24b, a fourth metal plate 34 is provided. The fourth metal plate 34 connects the upper surface of the fourth semiconductor chip 24a and the upper surface of the fourth diode 24b and the upper surface of the fifth conductive layer 15. That is, the fourth metal plate 34 electrically connects the upper surface of the fourth semiconductor chip 24a and the back surface of the sixth semiconductor chip 26a.

The first metal plate 31 to the fourth metal plate 34 are electrically connected with emitters of the first semiconductor chip 21a to the sixth semiconductor chip 26a respectively. In addition, the first metal plate 31 to the fourth metal plate 34 are electrically connected with anodes of the first diode 21b to the sixth diode 26b, respectively. The first metal plate 31 to the fourth metal plate 34 are inner frames provided inside a package.

The semiconductor device 100 includes a first electrode terminal 35 to a fifth electrode terminal 39. The first electrode terminal 35 is provided on the upper surface of the second conductive layer 12, and is electrically connected with the back surface of the second semiconductor chip 22a. The first electrode terminal 35 is at the same potential as the first metal plate 31, and is provided separately from the second semiconductor chip 22a and the first metal plate 31.

A second electrode terminal 36 is provided on the upper surface of the first conductive layer 11. The second electrode terminal 36 is electrically connected with the back surface of the first semiconductor chip 21a, the third semiconductor chip 23a and the fourth semiconductor chip 24a. The second electrode terminal 36 is provided separately from the first semiconductor chip 21a, the third semiconductor chip 23a and the fourth semiconductor chip 24a.

A third electrode terminal 37 is provided on the upper surface of the third conductive layer 13. The third electrode terminal 37 is at the same potential as the second metal plate 32, and is provided separately from the second metal plate 32.

A fourth electrode terminal 38 is provided on the upper surface of the fourth conductive layer 14, and is electrically connected with the back surface of the fifth semiconductor chip 25a. The fourth electrode terminal 38 is at the same potential as the third metal plate 33, and is provided separately from the fifth semiconductor chip 25a and the third metal plate 33.

The fifth electrode terminal 39 is provided on the upper surface of the fifth conductive layer 15, and is electrically connected with the back surface of the sixth semiconductor chip 26a. The fifth electrode terminal 39 is at the same potential as the fourth metal plate 34, and is provided separately from the sixth semiconductor chip 26a and the fourth metal plate 34.

The semiconductor device 100 includes a plurality of signal terminals 40. The first semiconductor chip 21a to the sixth semiconductor chip 26a include, on the upper surfaces, signal terminal connection portions connected with the plurality of signal terminals 40 by wires 42. The signal terminal connection portion is a gate electrode of the first semiconductor chip 21a to the sixth semiconductor chip 26a. To the plurality of signal terminals 40, signals that switch the first semiconductor chip 21a to the sixth semiconductor chip 26a are inputted respectively.

The first electrode terminal 35 to the fifth electrode terminal 39 are main electrode frames that perform input/output of power with outside. In the present embodiment, the second electrode terminal 36 is a P terminal of an inverter. In addition, the third electrode terminal 37 is an N terminal of the inverter. The first electrode terminal 35, the fourth electrode terminal 38 and the fifth electrode terminal 39 are AC output terminals of the inverter.

The first semiconductor chip 21a, the third semiconductor chip 23a and the fourth semiconductor chip 24a form an upper arm. The second semiconductor chip 22a, the fifth semiconductor chip 25a and the sixth semiconductor chip 26a form a lower arm. Between the metal plate connected to the semiconductor chips of the upper arm and the AC output terminals, the semiconductor chips of the lower arm are arranged. The first electrode terminal 35 to the fifth electrode terminal 39 are connected to the conductive layer without interposing the semiconductor chip.

The insulation substrate 10, the first semiconductor chip 21a to the sixth semiconductor chip 26a, the first diode 21b to the sixth diode 26b, the first metal plate 31 to the fourth metal plate 34, the first electrode terminal 35 to the fifth electrode terminal 39 and the plurality of signal terminals 40 are covered with a sealing resin 50. The sealing resin 50 forms the package of the semiconductor device 100.

The first electrode terminal 35 to the fifth electrode terminal 39 and the plurality of signal terminals 40 extend to an outer side of the sealing resin 50. Therefore, the first electrode terminal 35 to the fifth electrode terminal 39 and the plurality of signal terminals 40 are connectable from the outside of the semiconductor device 100.

In the sealing resin 50, between the first metal plate 31, the third metal plate 33 and the fourth metal plate 34 and the second metal plate 32, a groove 51 extending downwards from the upper surface of the sealing resin 50 is formed. In the present embodiment, the first semiconductor chip 21a, the third semiconductor chip 23a and the fourth semiconductor chip 24a are lined up on the upper surface of the first conductive layer 11 along a longitudinal direction of the package. Similarly, the second semiconductor chip 22a, the fifth semiconductor chip 25a and the sixth semiconductor chip 26a are lined up along the longitudinal direction of the package. The groove 51 extends along the direction in which the first semiconductor chip 21a, the third semiconductor chip 23a and the fourth semiconductor chip 24a are lined up.

The first metal plate 31 includes, at an end facing the second metal plate 32, a first exposed portion 31b exposed from a side face of the sealing resin 50 forming the groove 51. The second metal plate 32 includes, at an end facing the first metal plate 31, a second exposed portion 32b exposed from a side face of the sealing resin 50 forming the groove 51. Similarly, the third metal plate 33 includes, at an end facing the second metal plate 32, a third exposed portion 33b exposed from the side face of the sealing resin 50 forming the groove 51. In addition, the fourth metal plate 34 includes, at an end facing the second metal plate 32, a fourth exposed portion 34b exposed from the side face of the sealing resin 50 forming the groove 51. The first exposed portion 31b, the third exposed portion 33b and the fourth exposed portion 34b face the second exposed portion 32b across the groove.

Figure 3:
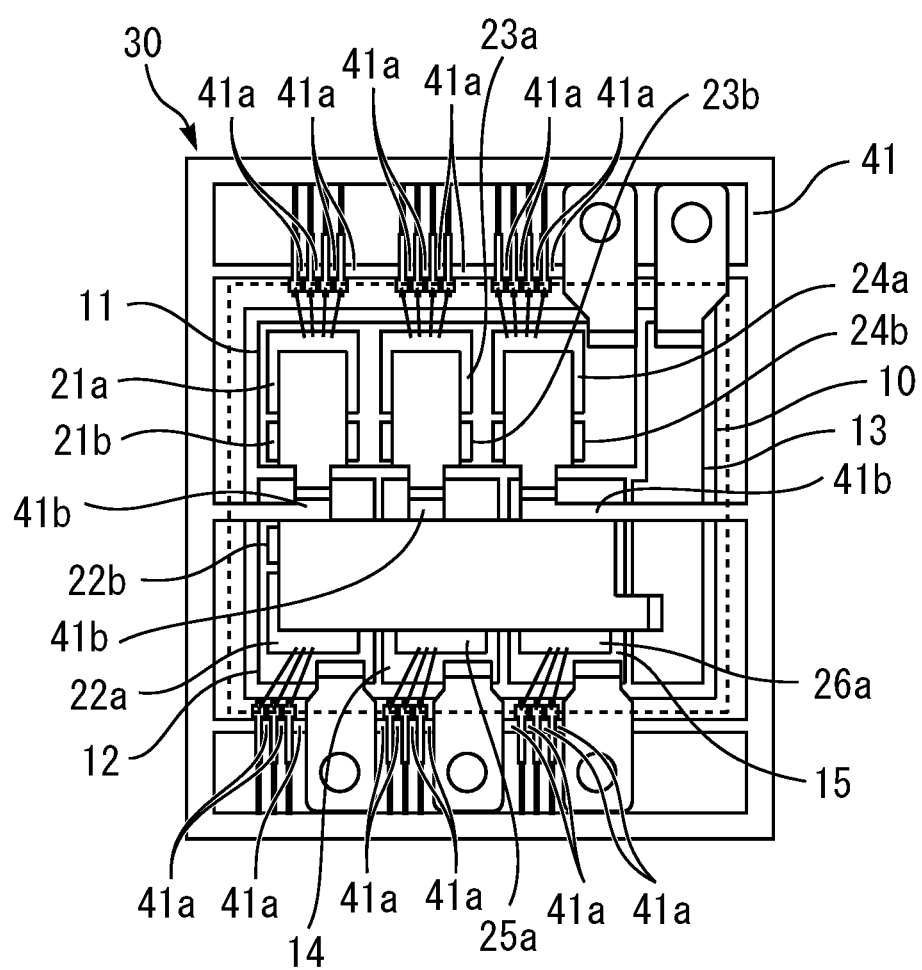
FIG. 3 is a drawing illustrating a state of loading the frame on the semiconductor chips.

Next, a method for manufacturing the semiconductor device 100 will be described. First, a frame 30 is loaded on the first semiconductor chip 21a to the sixth semiconductor chip 26a. FIG. 3 is a drawing illustrating a state of loading the frame 30 on the semiconductor chips. In the frame 30, the first metal plate 31 to the fourth metal plate 34, the first electrode terminal 35 to the fifth electrode terminal 39 and the plurality of signal terminals 40 are integrated through a connection portion 41.

The connection portion 41 includes an external connection portion 41a and an internal connection portion 41b. The external connection portion 41a connects the first electrode terminal 35 to the fifth electrode terminal 39 and the plurality of signal terminals 40 outside the package. The internal connection portion 41b connects the first metal plate 31 to the fourth metal plate 34 inside the package. The connection portion 41 is also referred to as a runner member.

The first metal plate 31 to the fourth metal plate 34, the first electrode terminal 35 to the fifth electrode terminal 39, the plurality of signal terminals 40 and the connection portion 41 are formed of a conductive metal. The conductive metal is copper for example.

Here, the frame 30 is loaded such that the first metal plate 31 is provided on the upper surface of the first semiconductor chip 21a and the second metal plate 32 is provided on the upper surfaces of the second semiconductor chip 22a, the fifth semiconductor chip 25a and the sixth semiconductor chip 26a. Similarly, the third metal plate 33 and the fourth metal plate 34 are respectively provided on the upper surfaces of the third semiconductor chip 23a and the fourth semiconductor chip 24a.

Figure 4:
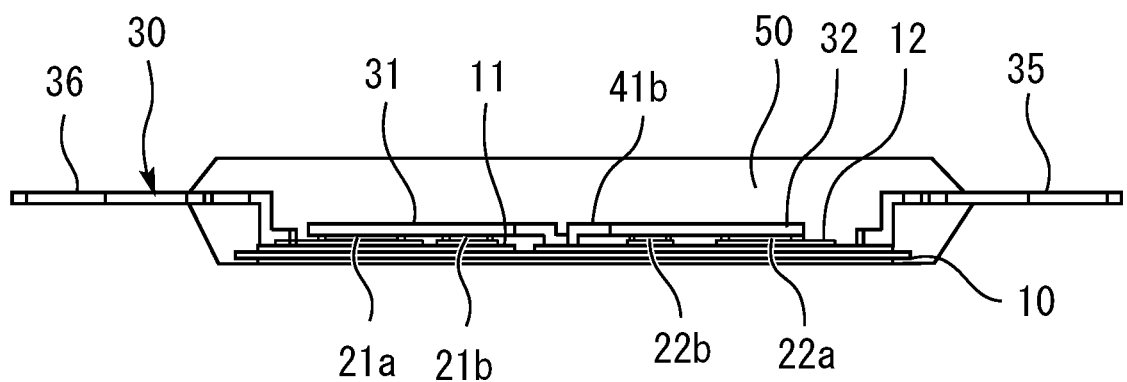
FIG. 4 is a drawing explaining the sealing step.

Next, a sealing step is performed. FIG. 4 is a drawing explaining the sealing step. In the sealing step, the insulation substrate 10, the first semiconductor chip 21a to the sixth semiconductor chip 26a and the frame 30 are covered with the sealing resin 50. The sealing resin 50 is formed of an epoxy resin for example.

Figure 5:
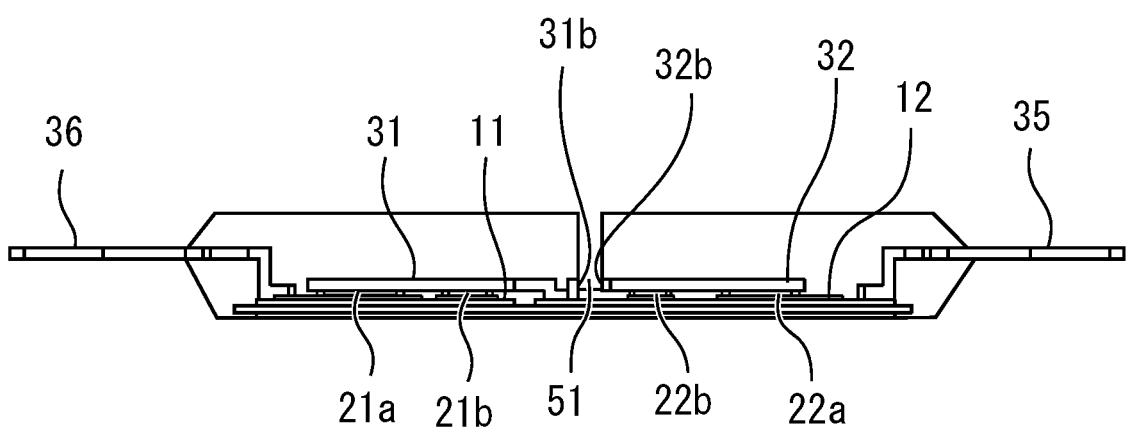
FIG. 5 is a drawing explaining the removal step.

Then, a removal step is performed. FIG. 5 is a drawing explaining the removal step. In the removal step, the sealing resin 50 and the internal connection portion 41b are simultaneously cut off. Thus, the internal connection portion 41b is notched together with the sealing resin 50, and the groove 51 is formed in the sealing resin 50. In the removal step, the first metal plate 31, the third metal plate 33 and the fourth metal plate 34 and the second metal plate 32 are separated and insulated, and a circuit is formed. In addition, in the removal step, the external connection portion 41a is also removed, and the first electrode terminal 35 to the fifth electrode terminal 39 and the plurality of signal terminals 40 are separated from each other. A cutter for example is used for cutting. Here, a width of the groove 51 may be increased so as to secure a sufficient insulation distance.

Further, as illustrated in FIG. 4, the internal connection portion 41b may be provided on a position higher than a portion adjacent to the internal connection portion 41b of the frame 30. The first metal plate 31 includes, on the end facing the second metal plate 32, a tip portion 31a extending upwards. The internal connection portion 41b connects the tip portion 31a and the second metal plate 32 at the position higher than the portion provided on the upper surface of the second conductive layer 12 of the first metal plate 31. In this case, the first exposed portion 31b is provided on the position higher than the portion provided on the upper surface of the second conductive layer 12 of the first metal plate 31.

According to the configuration, when cutting the internal connection portion 41b, there is no need of performing cutting to a depth of the insulation substrate 10, and damages of the insulation substrate 10 can be prevented. Therefore, the internal connection portion 41b can be easily cut off, and a dimension of the semiconductor device 100 can be easily controlled. Thus, assemblability, a mounting yield and reliability can be improved. In addition, since the groove 51 can be made shallow, processing time can be reduced. Further, an external device may be connected to the tip portion 31a and voltage detection may be performed.

In the present embodiment, the connection portion 41 of the frame 30 can have a function of positioning with a jig. Thus, the first metal plate 31 to the fourth metal plate 34 can be accurately arranged. In addition, resin sealing is performed in a state where the first metal plate 31 to the fourth metal plate 34 are integrated through the connection portion 41, the groove 51 is provided in the sealing resin 50 thereafter and the connection portion 41 is removed. Since the connection portion 41 is cut off in the state of being fixed by the sealing resin 50, cutting can be accurately performed. Further, position deviation of the first metal plate 31 to the fourth metal plate 34 can be prevented. Thus, positioning accuracy of the metal plates inside the package can be improved.

In addition, in a structure where a main electrode terminal is directly connected with a semiconductor apparatus, when the semiconductor apparatus is operated with an overload, it is possible that the main electrode terminal receives heat interference from the semiconductor apparatus. At the time, there is a risk that a temperature of the main electrode terminal becomes close to a using temperature limit of a product. In contrast, in the present embodiment, the first electrode terminal 35 to the fifth electrode terminal 39 are directly joined to the first conductive layer 11 to the fifth conductive layer 15 near a heat radiation surface. Here, the heat radiation surface is the back surface of the insulation substrate 10 for example. Thus, the temperature of the main electrode terminal can be suppressed.

Further, in the present embodiment, since the first electrode terminal 35 to the fifth electrode terminal 39 are directly joined to the first conductive layer 11 to the fifth conductive layer 15, a case may not be provided. Thus, compared to the structure that the main electrode terminal is insert-molded in the case, the semiconductor device 100 can be miniaturized.

Figure 6:
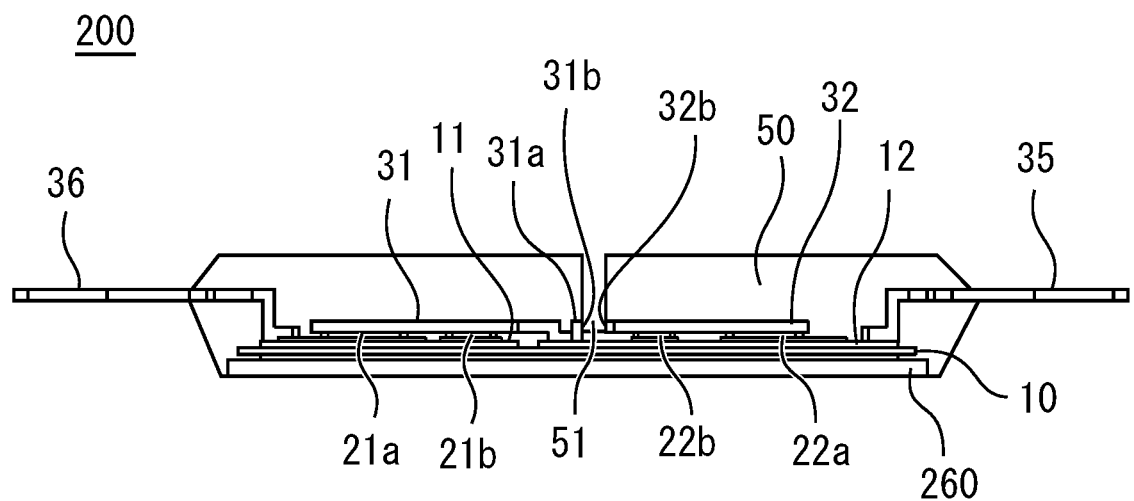
FIG. 6 is a sectional view of a semiconductor device relating to a first modification of the first embodiment.

FIG. 6 is a sectional view of a semiconductor device 200 relating to a first modification of the first embodiment. In the semiconductor device 200, a base plate 260 is provided on the back surface of the insulation substrate 10. With the base plate 260, a higher heat radiation property can be secured. In addition, a warp of the semiconductor device 200 can be suppressed.

Figure 7:
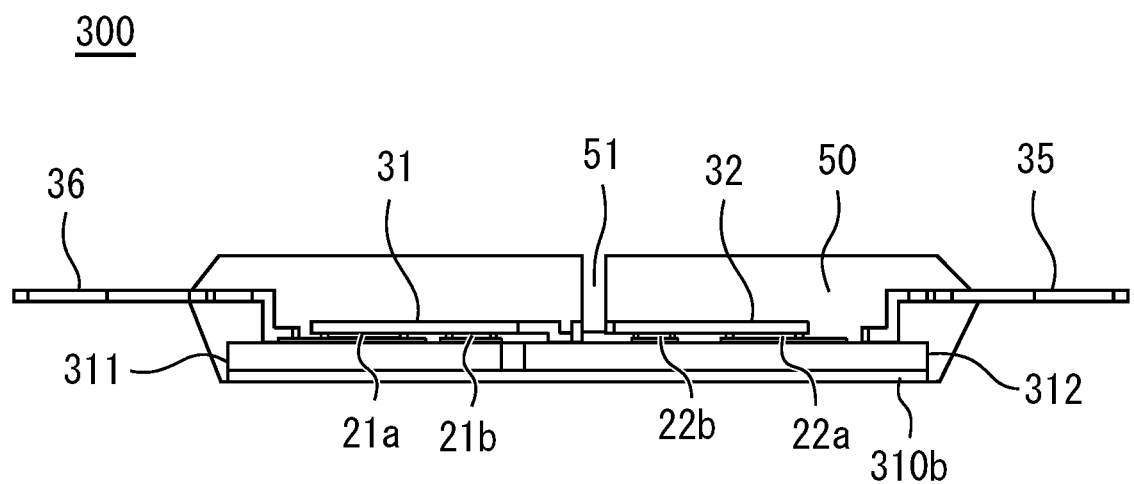
FIG. 7 is a sectional view of a semiconductor device relating to a second modification of the first embodiment.

FIG. 7 is a sectional view of a semiconductor device 300 relating to a second modification of the first embodiment. In the semiconductor device 300, a first conductive layer 311 and a second conductive layer 312 are conductive plates. Similarly, a third conductive layer to a fifth conductive layer are also formed of the conductive plates. On the back surfaces of the first conductive layer 311 and the second conductive layer 312, an insulating sheet 310b is provided. The insulating sheet 310b may be an insulating plate. By using the conductive plates instead of the conductive patterns, the heat radiation property can be improved. In addition, the warp of the semiconductor device 300 can be suppressed.

Figure 8:
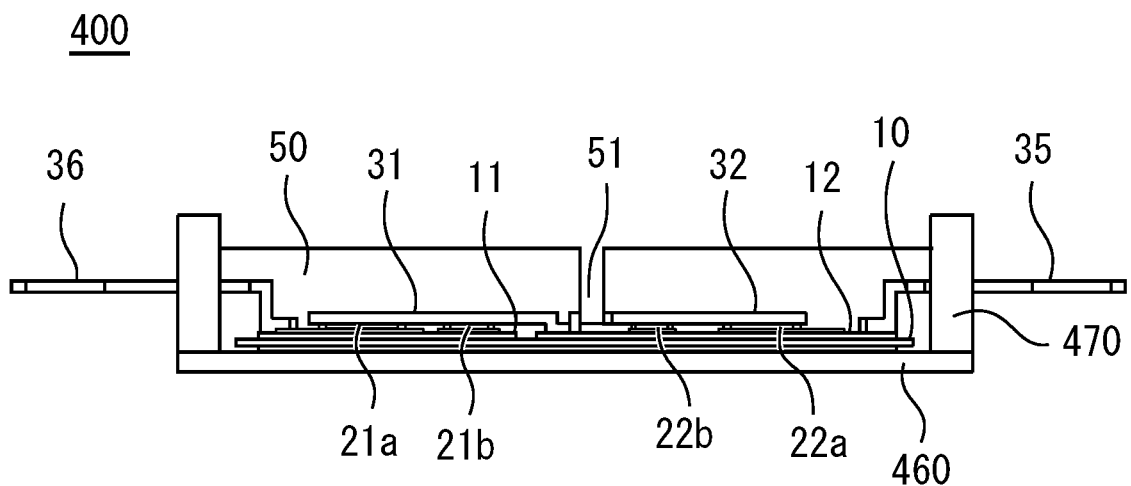
FIG. 8 is a sectional view of a semiconductor device relating to a third modification of the first embodiment.

FIG. 8 is a sectional view of a semiconductor device 400 relating to a third modification of the first embodiment. The semiconductor device 400 includes a base plate 460 and a case 470 that is provided on the base plate 460 and stores the insulation substrate 10. By the case 470, the position of the sealing resin 50 can be determined. Thus, there is no need to prepare a die for positioning the sealing resin 50.

Figure 9:
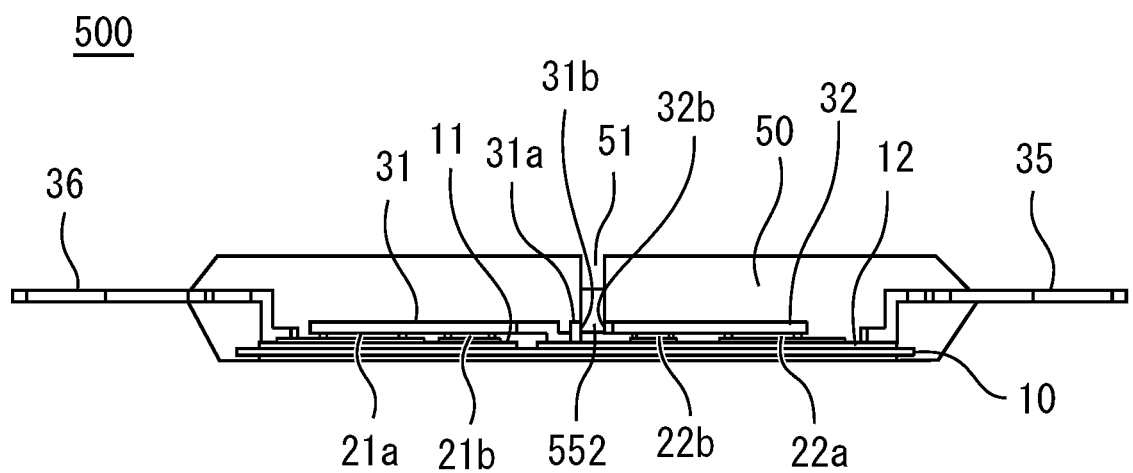
FIG. 9 is a sectional view of a semiconductor device relating to a fourth modification of the first embodiment.

FIG. 9 is a sectional view of a semiconductor device 500 relating to a fourth modification of the first embodiment. In the semiconductor device 500, the side face of the sealing resin 50 forming the groove 51 is covered with an insulating tape 552. That is, the first exposed portion 31b to the fourth exposed portion 34b are covered with the insulating tape 552. By sticking the insulating tape 552, an insulation property can be secured.

In addition, without being limited to the insulating tape 552, an insulating sealing material may be applied. The sealing material provided in the groove 51 is an epoxy resin or silicone gel for example. The sealing material is provided by potting.

Figure 10:
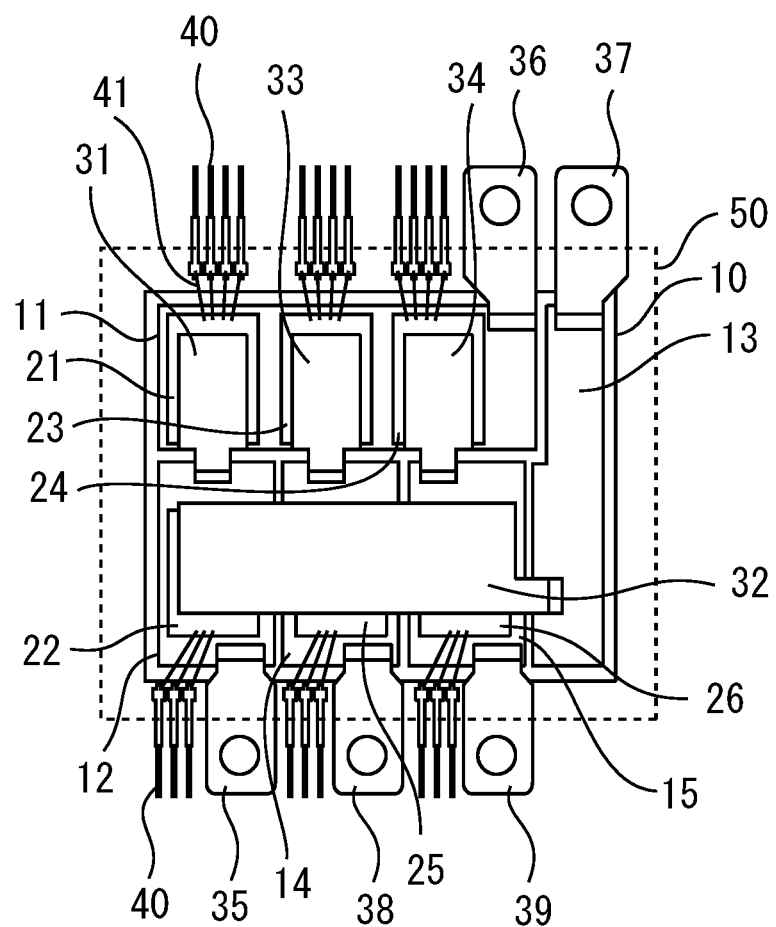
FIG. 10 is a plan view of a semiconductor device relating to a fifth modification of the first embodiment.

FIG. 10 is a plan view of a semiconductor device 100a relating to a fifth modification of the first embodiment. In the semiconductor device 100a, instead of the first semiconductor chip 21a to the sixth semiconductor chip 26a and the first diode 21b to the sixth diode 26b, a first semiconductor chip 21 to a sixth semiconductor chip 26 are provided. The first semiconductor chip 21 to the sixth semiconductor chip 26 are RC (Reverse-conducting)-IGBTs. In addition, the first semiconductor chip 21 to the sixth semiconductor chip 26 may be MOSFETs, and reflux may be performed by a body diode.

In the semiconductor device 100a, one chip that performs switching and the reflux is used as the first semiconductor chip 21 to the sixth semiconductor chip 26. Thus, the semiconductor device 100a can be miniaturized. In addition, generally, in the case of performing the switching and the reflux by one chip, the heat interference to the main electrode terminal increases. The structure of the present embodiment can improve the heat radiation property and suppress the temperature of the main electrode terminal as described above. Therefore, it is effective especially in the case of performing the switching and the reflux by one chip like the semiconductor device 100a.

Further, at least one of the first semiconductor chip 21a to the sixth semiconductor chip 26a and the first diode 21b to the sixth diode 26b may be made with a wide band gap semiconductor. The wide band gap semiconductor is silicon carbide, a gallium-nitride-based material or diamond. For the wide band gap semiconductor, it is generally difficult to widen an effective area. Therefore, by adopting a DLB structure capable of directly joining a metal layer, the assemblability can be improved.

In addition, for a switching element and a diode element made with the wide band gap semiconductor, in general, voltage resistance is high and an allowable current density is high. Therefore, the semiconductor device 100 can be further miniaturized.

Further, in the present embodiment, the groove 51 extends along the direction in which the first semiconductor chip 21a, the third semiconductor chip 23a and the fourth semiconductor chip 24a are lined up. Not only that, the plurality of grooves 51 may be provided respectively on a portion between the first metal plate 31 and the second metal plate 32, a portion between the third metal plate 33 and the second metal plate 32, and a portion between the fourth metal plate 34 and the second metal plate 32.

Moreover, in the present embodiment, an example that the semiconductor device 100 is a three-phase inverter is illustrated. Not only that, the semiconductor device 100 may be any semiconductor device having the DLB structure. In addition, the semiconductor device 100 of the present embodiment includes six semiconductor chips. Without being limited to that, the semiconductor device 100 may include two or more semiconductor chips. The semiconductor device 100 may be a single-phase inverter or the like.

These modifications can be applied, as appropriate, to a semiconductor device and a method for manufacturing the semiconductor device according to the following embodiments. Note that the semiconductor device and the method for manufacturing the semiconductor device according to the following embodiments are similar to those of the first embodiment in many respects, and thus differences between the semiconductor device and the method for manufacturing the semiconductor device according to the following embodiments and those of the first embodiment will be mainly described below.

Second Embodiment

Figure 11:
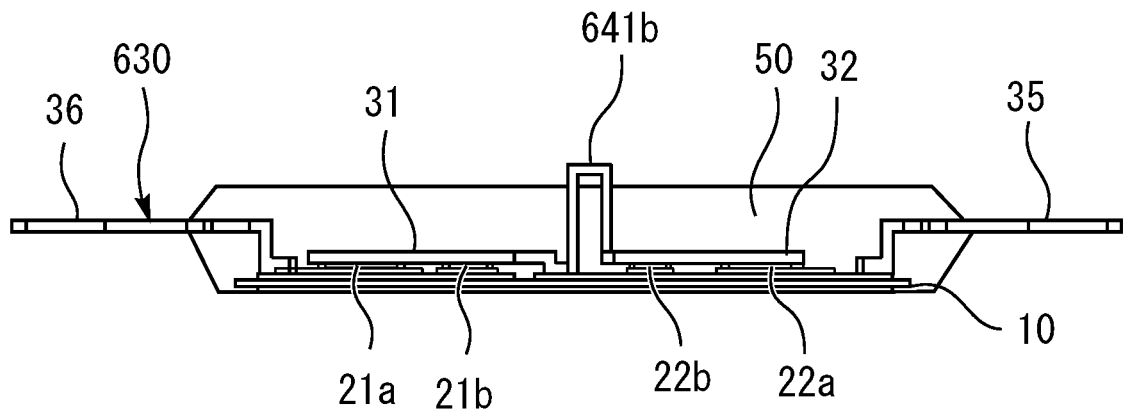
FIG. 11 is a drawing explaining the method for manufacturing a semiconductor device relating to the second embodiment.

FIG. 11 is a drawing explaining the method for manufacturing a semiconductor device 600 relating to the second embodiment. In the present embodiment, the structure of a frame 630 is different from the first embodiment. In the frame 630, the end facing the second metal plate 32 of the first metal plate 31 extends toward the upper surface of the sealing resin 50, and is exposed from the upper surface of the sealing resin 50. In addition, the end facing the first metal plate 31 of the second metal plate 32 extends toward the upper surface of the sealing resin 50, and is exposed from the upper surface of the sealing resin 50. The end of the first metal plate 31 and the end of the second metal plate 32 extend upwards in parallel.

Similarly, the end facing the second metal plate 32 of the third metal plate 33 extends toward the upper surface of the sealing resin 50, and is exposed from the upper surface of the sealing resin 50. The end facing the second metal plate 32 of the fourth metal plate 34 extends toward the upper surface of the sealing resin 50, and is exposed from the upper surface of the sealing resin 50.

An internal connection portion 641b connects the portion exposed from the sealing resin 50 of the first metal plate 31 and the portion exposed from the sealing resin 50 of the second metal plate 32. Similarly, the internal connection portion 641b connects the portions exposed from the sealing resin 50 of the third metal plate 33 and the fourth metal plate 34 and the portion exposed from the sealing resin 50 of the second metal plate 32. In the embodiment, the internal connection portion 641b is provided on the position higher than the upper surface of the sealing resin 50. In the removal step, the sealing resin 50 is not cut off and the internal connection portion 641b is cut off.

Figure 12:
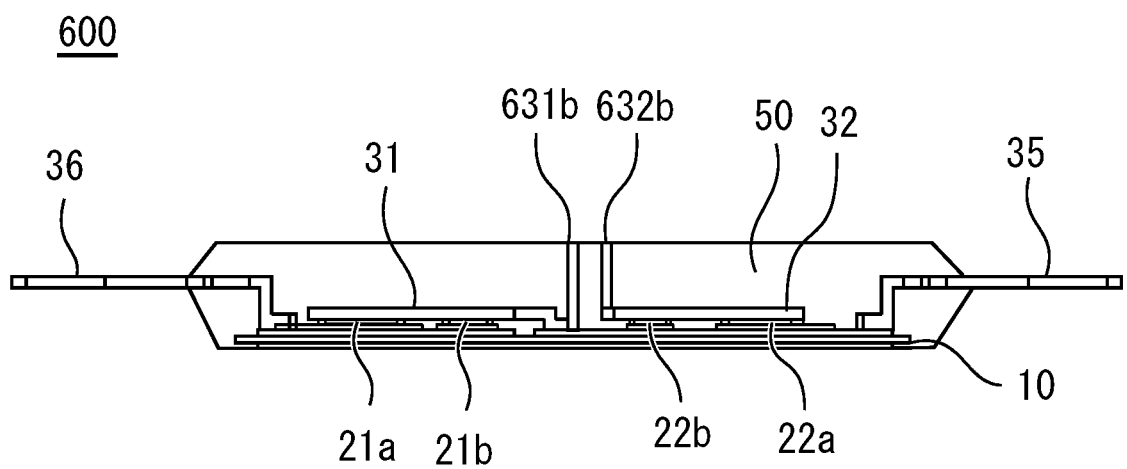
FIG. 12 is a sectional view of the semiconductor device relating to the second embodiment.

FIG. 12 is a sectional view of the semiconductor device 600 relating to the second embodiment. In the semiconductor device 600, a first exposed portion 631b is formed by exposing the end of the first metal plate 31 from the upper surface of the sealing resin 50. In addition, a second exposed portion 632b is formed by exposing the end of the second metal plate 32 from the upper surface of the sealing resin 50. Similarly, a third exposed portion and a fourth exposed portion are formed by exposing the ends of the third metal plate 33 and the fourth metal plate 34 from the upper surface of the sealing resin 50.

In the present embodiment, since the sealing resin 50 is not cut off, resin waste to be a foreign matter is not generated. Thus, the reliability can be improved.

In the present embodiment, the metal plates are exposed from the upper surface of the sealing resin 50. Without being limited to that, the metal plates may be exposed from the side face of the sealing resin 50.

Third Embodiment

Figure 13:
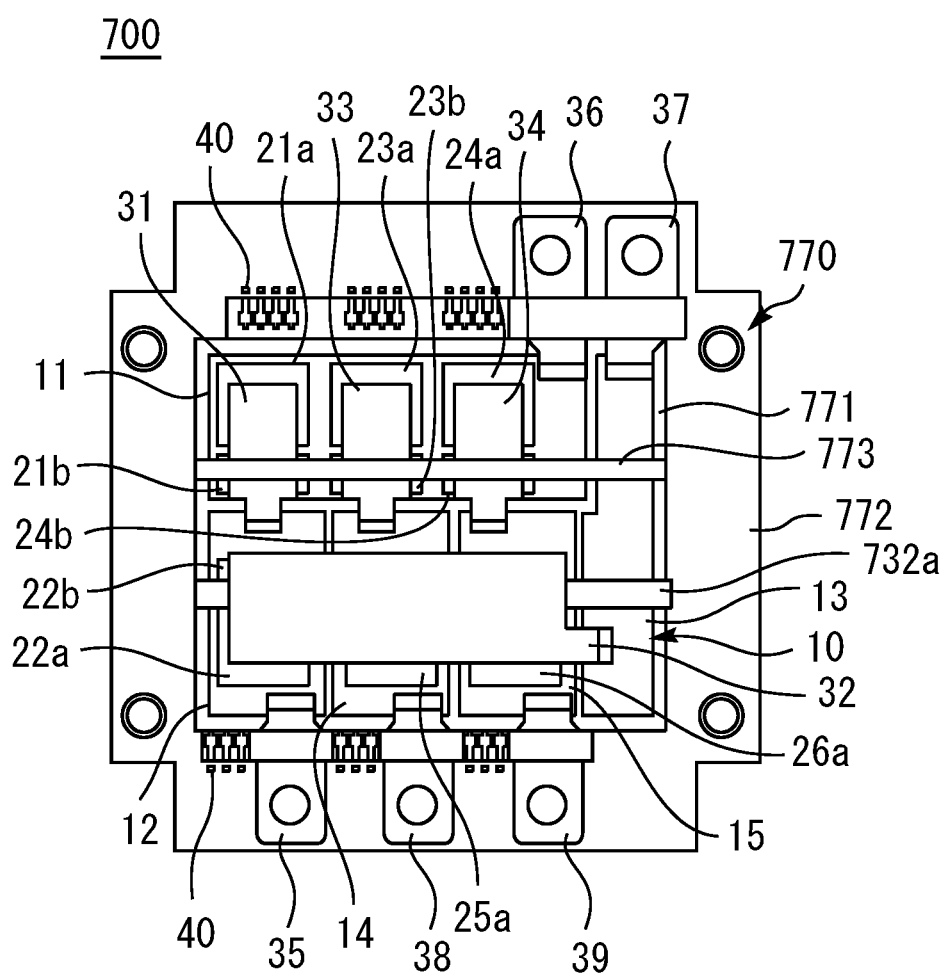
FIG. 13 is a plan view of a semiconductor device relating to the third embodiment.

FIG. 13 is a plan view of a semiconductor device 700 relating to the third embodiment. The semiconductor device 700 includes a case 770. The case 770 includes a storage portion 771, and a peripheral portion 772 surrounding the storage portion 771. The storage portion 771 stores the insulation substrate 10, the first semiconductor chip 21a to the sixth semiconductor chip 26a, the first diode 21b to the sixth diode 26b and the first metal plate 31 to the fourth metal plate 34. The storage portion 771 is sealed by the sealing resin 50. In FIG. 13, the sealing resin 50 is omitted for convenience. The sealing resin 50 is formed of the epoxy resin or the silicone gel for example.

The first electrode terminal 35 to the fifth electrode terminal 39 extend to the outer side of the storage portion 771. The first electrode terminal 35 to the fifth electrode terminal 39 and the signal terminals 40 are fixed to the peripheral portion 772.

The case 770 includes a fixing portion 773. The fixing portion 773 is provided in a belt shape in the direction in which the first semiconductor chip 21a, the third semiconductor chip 23a and the fourth semiconductor chip 24a are lined up. The fixing portion 773 is provided on the first metal plate 31, the third metal plate 33 and the fourth metal plate 34. The fixing portion 773 fixes the first metal plate 31, the third metal plate 33 and the fourth metal plate 34 to the case 770.

In addition, from the second metal plate 32, a fixing portion 732a extends toward the peripheral portion 772. By the fixing portion 732a, the second metal plate 32 is fixed to the case 770. From the above, the first metal plate 31 to the fourth metal plate 34 are fixed to the case 770.

In the present embodiment, the first metal plate 31 to the fourth metal plate 34 and the first electrode terminal 35 to the fifth electrode terminal 39 are integrated with the case 770. Thus, the dimension of the semiconductor device 700 can be easily controlled. In addition, the mounting yield and the reliability of the semiconductor device 700 can be improved. Further, since the removal step of the connection portion 41 is not needed, the semiconductor device 700 can be easily assembled.

Moreover, in the case where the first metal plate 31 to the fourth metal plate 34 are independent of the case 770, it is needed to perform positioning by a jig and execute assembly in general. In the present embodiment, the jig for positioning is not needed, and an assembly cost can be reduced.

In addition, the fixing portion 773 in the belt shape may be provided on the second metal plate 32 and fix the second metal plate 32 to the case 770.

Figure 14:
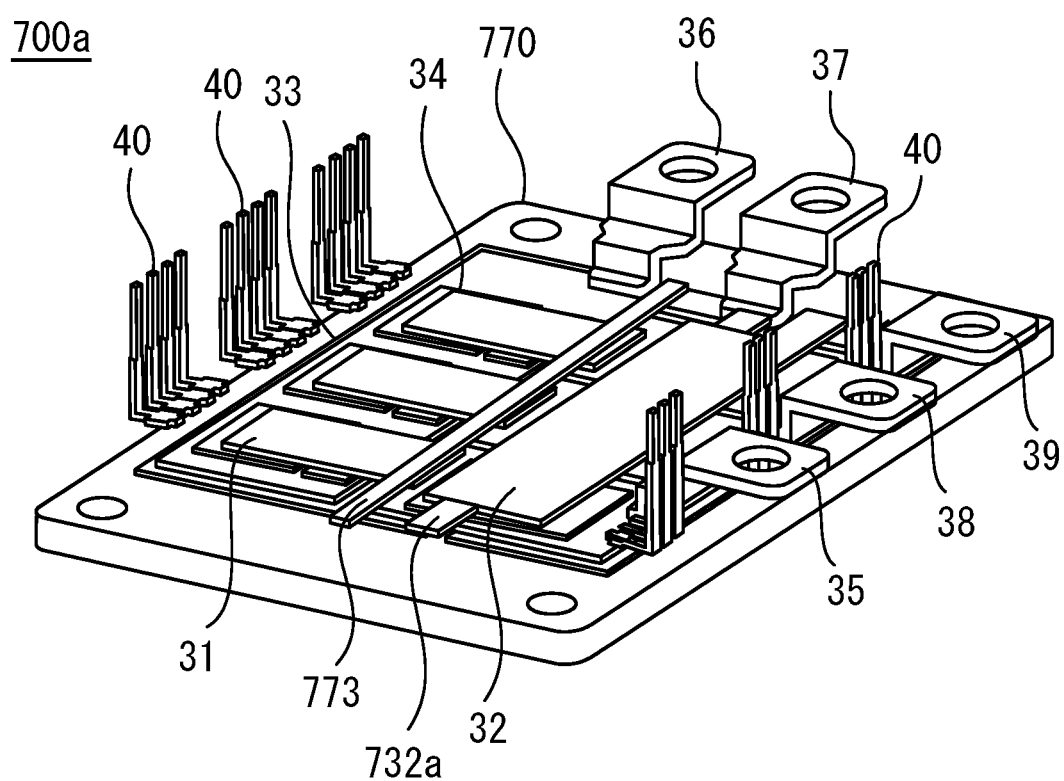
FIG. 14 is a plan view of a semiconductor device relating to a first modification of the third embodiment.

FIG. 14 is a plan view of a semiconductor device 700a relating to a first modification of the third embodiment. In the semiconductor device 700a, a thickness of the first metal plate 31 to the fourth metal plate 34 and the thickness of the first electrode terminal 35 to the fifth electrode terminal 39 are different. In the present embodiment, the first metal plate 31 to the fourth metal plate 34 and the first electrode terminal 35 to the fifth electrode terminal 39 are provided separately without being connected by the connection portion 41. Thus, the thickness of the first metal plate 31 to the fourth metal plate 34 and the thickness of the first electrode terminal 35 to the fifth electrode terminal 39 can be set respectively.

For example, the first electrode terminal 35 to the fifth electrode terminal 39 may be formed thick and the first metal plate 31 to the fourth metal plate 34 may be formed thin. Thus, by the first electrode terminal 35 to the fifth electrode terminal 39 that are thick, large current conduction is made possible. In addition, by the first metal plate 31 to the fourth metal plate 34 that are thin, stress on the semiconductor chips can be reduced.

Such a structure is particularly effective when the semiconductor chips are made of SiC. Since a modulus of longitudinal elasticity of the SiC is generally high, the stress that the semiconductor chips receive from the first metal plate 31 to the fourth metal plate 34 tends to become large. In the semiconductor device 700a, by thinning the first metal plate 31 to the fourth metal plate 34, the stress can be reduced and the reliability can be improved.

Further, the first metal plate 31 to the fourth metal plate 34 may be made thick. Thus, the heat radiation property of the semiconductor chips can be improved.

Figure 15:
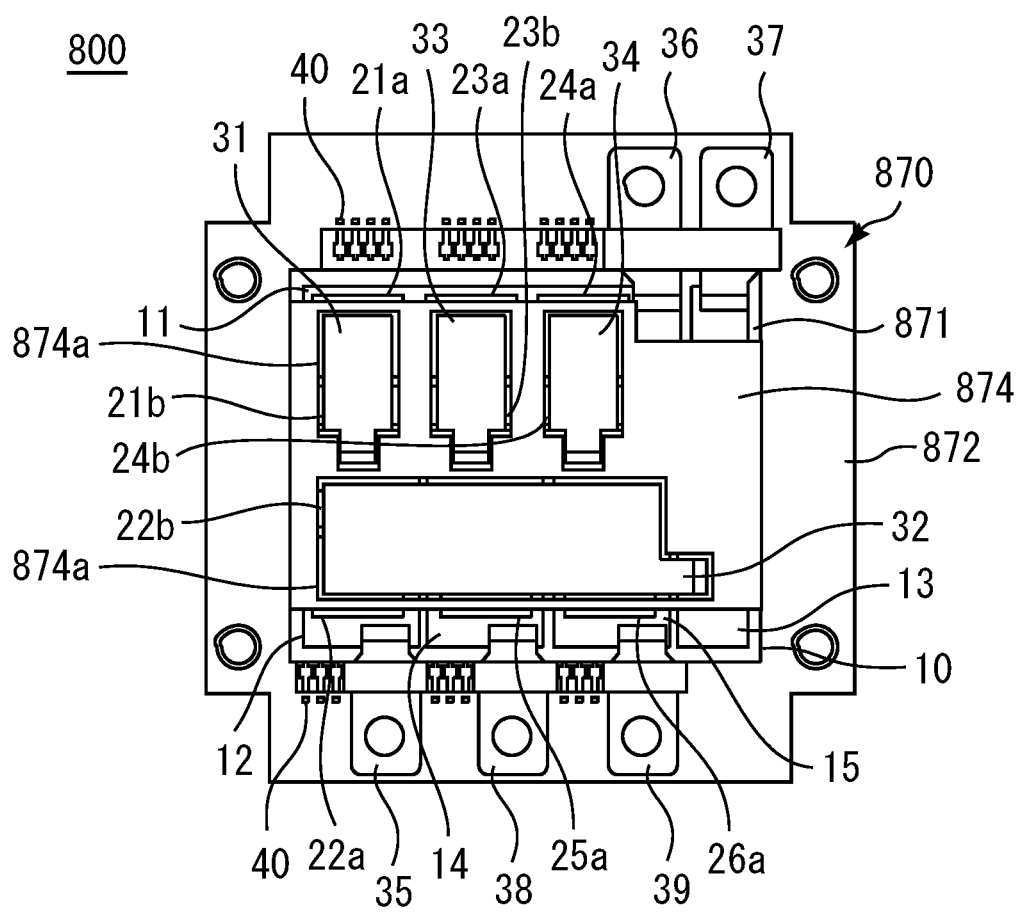
FIG. 15 is a plan view of a semiconductor device relating to a second modification of the third embodiment.

FIG. 15 is a plan view of a semiconductor device 800 relating to a second modification of the third embodiment. A case 870 includes a positioning portion 874. The positioning portion 874 includes a plurality of openings 874a that store and fix the first metal plate 31 to the fourth metal plate 34. Shapes of the plurality of openings 874a respectively correspond to the shapes of the first metal plate 31 to the fourth metal plate 34. Also in the semiconductor device 800, the jig for positioning is not needed and the assembly cost can be reduced.

Note that, in order to make wire bonding with the signal terminals 40 possible, the signal terminal connection portions of the first semiconductor chip 21a to the sixth semiconductor chip 26a are exposed from the positioning portion 874.

Figure 16:
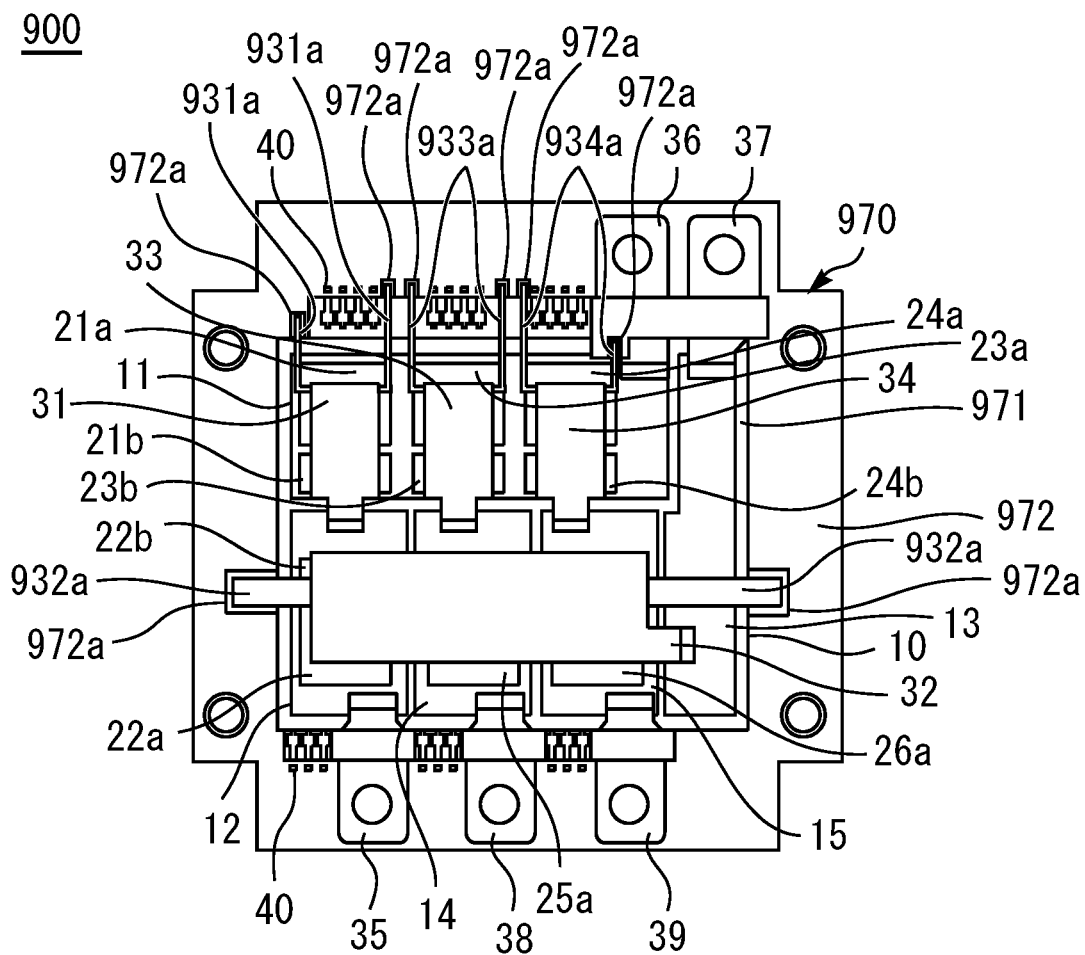
FIG. 16 is a plan view of a semiconductor device relating to a third modification of the third embodiment.

FIG. 16 is a plan view of a semiconductor device 900 relating to a third modification of the third embodiment. The semiconductor device 900 includes a case 970. The first metal plate 31 to the fourth metal plate 34 respectively include projections 931a to 934a extending toward a peripheral portion 972 of the case 970. On the peripheral portion 972, a plurality of recesses 972a to be fitted respectively with the projections 931a to 934a are formed.

By fitting of the projections 931a to 934a and the plurality of recesses 972a, the first metal plate 31 to the fourth metal plate 34 are positioned to the case 970. Also in the semiconductor device 900, the jig for positioning is not needed and the assembly cost can be reduced.

Figure 17:
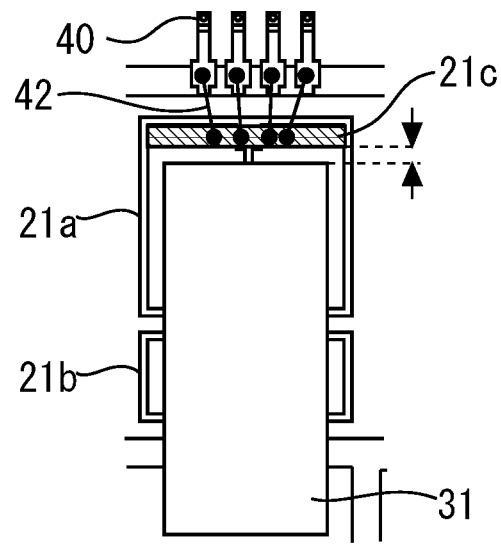
FIG. 17 is a drawing explaining the method for manufacturing the semiconductor device relating to a fourth modification of the third embodiment.

FIG. 17 is a drawing explaining the method for manufacturing the semiconductor device 800 relating to a fourth modification of the third embodiment. In FIG. 17, the positioning portion 874 is omitted for convenience. The semiconductor device 800 may be manufactured as follows. First, the first electrode terminal 35 to the fifth electrode terminal 39 and the plurality of signal terminals 40 are fixed to a peripheral portion 872 of the case 870.

Next, a storage step is executed. In the storage step, the first semiconductor chip 21a to the sixth semiconductor chip 26a are stored in a storage portion 871. Thus, the first electrode terminal 35 and the back surface of the second semiconductor chip 22a are electrically connected. In addition, the second electrode terminal 36 and the back surfaces of the first semiconductor chip 21a, the third semiconductor chip 23a and the fourth semiconductor chip 24a are electrically connected. Further, the fourth electrode terminal 38 and the fifth electrode terminal 39 and the back surfaces of the fifth semiconductor chip 25a and the sixth semiconductor chip 26a are electrically connected respectively.

A connection step is executed after the storage step. In the connection step, the plurality of signal terminal connection portions provided on the upper surfaces of the first semiconductor chip 21a to the sixth semiconductor chip 26a and the plurality of signal terminals are respectively connected by wires. FIG. 17 illustrates a signal terminal connection portion 21c of the first semiconductor chip 21a for example.

After the connection step, the first metal plate 31 to the fourth metal plate 34 are fixed to the case 870. That is, the first metal plate 31 to the fourth metal plate 34 are respectively stored in the plurality of openings 874a. Thus, the upper surface of the first semiconductor chip 21a and the back surface of the second semiconductor chip 22a are electrically connected by the first metal plate 31. Similarly, the upper surfaces of the second semiconductor chip 22a, the fifth semiconductor chip 25a and the sixth semiconductor chip 26a and the upper surface of the third conductive layer 13 are connected by the second metal plate 32. Further, the upper surface of the third semiconductor chip 23a and the back surface of the fifth semiconductor chip 25a are electrically connected by the third metal plate 33, and the upper surface of the fourth semiconductor chip 24a and the back surface of the sixth semiconductor chip 26a are electrically connected by the fourth metal plate 34.

In the semiconductor device 800, after the insulation substrate 10 is stored in the case 870, the first metal plate 31 to the fourth metal plate 34 can be attached to the case 870. Therefore, after the wire bonding of the semiconductor chips and the signal terminals 40 is executed, the first metal plate 31 to the fourth metal plate 34 can be attached to the case 870. Thus, a distance between the first metal plate 31 to the fourth metal plate 34 and the signal terminal connection portions of the semiconductor chips can be shortened. The distance between the signal terminal connection portion 21c and the first metal plate 31 is 1 mm or shorter for example.

In the semiconductor device 800, by reducing the distance between the signal terminal connection portions and the metal plates, an area of a main current conduction portion of the semiconductor chip can be widened. Thus, a current density can be improved. In addition, the manufacturing method of the fourth modification may be applied to the semiconductor device 900.

Note that the technical features described in the above embodiments may be combined as appropriate.

REFERENCE SIGNS LIST 100, 100a, 200, 300, 400, 500, 600, 700, 700a, 800, 900 semiconductor device, 10b insulating layer, 11-15 first conductive layer-fifth conductive layer, 21-26, 21a-26a first semiconductor chip-sixth semiconductor chip, 21c signal terminal connection portion, 30, 630 frame, 31-34 first metal plate-fourth metal plate, 31b, 631b first exposed portion, 32b, 632b second exposed portion, 33b third exposed portion, 34b fourth exposed portion, 35-39 first electrode terminal-fifth electrode terminal, 40 signal terminal, 41 connection portion, 42 wire, 50 sealing resin, 51 groove, 552 insulating tape, 470, 770, 870, 970 case, 771, 871 storage portion, 772, 872, 972 peripheral portion, 874a opening, 931a-934a projection, 972a recess.

The invention claimed is:

1. A semiconductor device comprising:
a first semiconductor chip;
a second semiconductor chip;
a first metal plate provided on an upper surface of the first semiconductor chip;
a second metal plate provided on an upper surface of the second semiconductor chip; and
a sealing resin covering the first semiconductor chip, the second semiconductor chip, the first metal plate and the second metal plate,
wherein a groove is formed in the sealing resin, the groove extending downwards from an upper surface of the sealing resin between the first metal plate and the second metal plate,
the first metal plate includes, at an end facing the second metal plate, a first exposed portion exposed from a side face of the sealing resin forming the groove, and
the second metal plate includes, at an end facing the first metal plate, a second exposed portion exposed from a side face of the sealing resin forming the groove.

2. The semiconductor device according to claim 1, comprising
a first electrode terminal extending to an outer side of the sealing resin, provided separately from the first metal plate, and electrically connected with a back surface of the second semiconductor chip,
wherein the first metal plate electrically connects the upper surface of the first semiconductor chip and the back surface of the second semiconductor chip.

3. The semiconductor device according to claim 1, comprising:
an insulating layer;
a first conductive layer provided on the insulating layer and including an upper surface on which the first semiconductor chip is provided;
a second conductive layer provided on the insulating layer and including an upper surface on which the second semiconductor chip is provided;
a third conductive layer provided on the insulating layer;
a first electrode terminal provided on the upper surface of the second conductive layer and extending to the outer side of the sealing resin;
a second electrode terminal provided on the upper surface of the first conductive layer and extending to the outer side of the sealing resin; and
a third electrode terminal provided on an upper surface of the third conductive layer and extending to the outer side of the sealing resin,
wherein the first metal plate connects the upper surface of the first semiconductor chip and the upper surface of the second conductive layer,
the second metal plate connects the upper surface of the second semiconductor chip and the upper surface of the third conductive layer,
the first electrode terminal is provided on the upper surface of the second conductive layer separately from the first metal plate and the second semiconductor chip,
the second electrode terminal is provided separately from the first semiconductor chip, and
the third electrode terminal is provided separately from the second metal plate.

4. The semiconductor device according to claim 3, comprising:
a fourth conductive layer and a fifth conductive layer provided on the insulating layer;

a third semiconductor chip and a fourth semiconductor chip provided on the upper surface of the first conductive layer;
a fifth semiconductor chip provided on an upper surface of the fourth conductive layer;
a sixth semiconductor chip provided on an upper surface of the fifth conductive layer;
a third metal plate connecting an upper surface of the third semiconductor chip and the upper surface of the fourth conductive layer; and
a fourth metal plate connecting an upper surface of the fourth semiconductor chip and the upper surface of the fifth conductive layer,
wherein the second metal plate connects an upper surface of the fifth semiconductor chip and an upper surface of the sixth semiconductor chip, and the upper surface of the third conductive layer,
the third metal plate includes a third exposed portion exposed from a side face of the sealing resin forming the groove,
the fourth metal plate includes a fourth exposed portion exposed from a side face of the sealing resin forming the groove, and
the third exposed portion and the fourth exposed portion face the second exposed portion across and the groove.

5. The semiconductor device according to claim 4,
wherein the first semiconductor chip, the third semiconductor chip and the fourth semiconductor chip are lined up on the upper surface of the first conductive layer, and
the groove extends along a direction in which the first semiconductor chip, the third semiconductor chip and the fourth semiconductor chip are lined up.

6. The semiconductor device according to claim 3, wherein the first exposed portion is provided at a position higher than a portion provided on the upper surface of the second conductive layer of the first metal plate.

7. The semiconductor device according to claim 1, wherein the side face of the sealing resin forming the groove is covered with an insulating tape or a sealing material.

8. A semiconductor device comprising:
a first semiconductor chip;
a second semiconductor chip;
a first metal plate provided on an upper surface of the first semiconductor chip;
a second metal plate provided on an upper surface of the second semiconductor chip; and
a sealing resin covering the first semiconductor chip, the second semiconductor chip, the first metal plate and the second metal plate,
wherein an end of the first metal plate facing the second metal plate extends toward an upper surface of the sealing resin, and is exposed from the upper surface of the sealing resin, and
an end of the second metal plate facing the first metal plate extends toward the upper surface of the sealing resin, and is exposed from the upper surface of the sealing resin.

9. A semiconductor device comprising:
a first semiconductor chip;
a second semiconductor chip;
a first metal plate electrically connecting an upper surface of the first semiconductor chip and a back surface of the second semiconductor chip;
a first electrode terminal provided separately from the first metal plate and electrically connected with the back surface of the second semiconductor chip;
a case including a storage portion configured to store the first semiconductor chip, the second semiconductor chip and the first metal plate, and a peripheral portion surrounding the storage portion; and
a sealing resin sealing the storage portion,
wherein the first electrode terminal extends to an outer side of the storage portion, and
the first metal plate is fixed to the case.

10. The semiconductor device according to claim 9, wherein the case includes an opening configured to store and fix the first metal plate.

11. The semiconductor device according to claim 10, wherein a shape of the opening corresponds to a shape of the first metal plate.

12. The semiconductor device according to claim 9, wherein the first metal plate includes a projection extending toward the peripheral portion, and
a recess is formed at the peripheral portion, the recess being to be fitted with the projection.

13. The semiconductor device according to claim 9, wherein the first electrode terminal is fixed to the peripheral portion.

14. The semiconductor device according to claim 9, wherein a thickness of the first metal plate and a thickness of the first electrode terminal are different.

15. The semiconductor device according to claim 9, comprising a signal terminal to which a signal that switches the first semiconductor chip is to be inputted,
wherein the first semiconductor chip includes, on the upper surface of the first semiconductor chip, a signal terminal connection portion connected with the signal terminal by a wire, and
a distance between the signal terminal connection portion and the first metal plate is 1 mm or shorter.

16. The semiconductor device according to claim 1, wherein at least one of the first semiconductor chip and the second semiconductor chip is made with a wide band gap semiconductor.

17. The semiconductor device according to claim 16, wherein the wide band gap semiconductor is silicon carbide, a gallium-nitride-based material or diamond.

18. A method for manufacturing a semiconductor device, comprising
loading a frame in which a first metal plate and a second metal plate are integrated through a connection portion such that the first metal plate is provided on an upper surface of a first semiconductor chip and the second metal plate is provided on an upper surface of a second semiconductor chip,
covering the frame, the first semiconductor chip and the second semiconductor chip with a sealing resin, and
forming a groove in the sealing resin by notching the connection portion together with the sealing resin so as to separate the first metal plate and the second metal plate.

19. The method for manufacturing the semiconductor device according to claim 18, wherein the connection portion is provided on a position higher than a portion adjacent to the connection portion of the frame.

20. A method for manufacturing a semiconductor device, comprising:
a step of fixing a first electrode terminal and a plurality of signal terminals to a peripheral portion of a case including a storage portion and the peripheral portion surrounding the storage portion;
a storage step of storing a first semiconductor chip and a second semiconductor chip in the storage portion, and electrically connecting the first electrode terminal and a back surface of the second semiconductor chip;

a connection step of connecting a signal terminal connection portion provided on an upper surface of the first semiconductor chip and a signal terminal connection portion provided on an upper surface of the second semiconductor chip and the plurality of signal terminals respectively by wires, after the storage step; and a step of fixing a first metal plate to the case, and electrically connecting the upper surface of the first semiconductor chip and the back surface of the second semiconductor chip by the first metal plate, after the connection step.

\* \* \* \* \*